(12) United States Patent
Do et al.

(10) Patent No.: US 7,919,838 B2
(45) Date of Patent: Apr. 5, 2011

(54) INTEGRATED CIRCUIT PACKAGE SYSTEM WITH ENCAPSULATION LOCK AND METHOD OF MANUFACTURE THEREOF

(75) Inventors: Byung Tai Do, Singapore (SG); Sung Uk Yang, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/690,092

(22) Filed: Jan. 19, 2010

(65) Prior Publication Data
US 2010/0117205 A1    May 13, 2010

Related U.S. Application Data

(63) Continuation of application No. 11/532,508, filed on Sep. 15, 2006, now abandoned.

(51) Int. Cl.
*H01L 23/495* (2006.01)
*H01L 21/56* (2006.01)
(52) U.S. Cl. ............. 257/666; 257/670; 257/E23.031; 257/E23.032; 257/E21.502; 438/124
(58) Field of Classification Search .......... 257/666, 257/670, E23.031, E23.032, E21.502; 438/124
See application file for complete search history.

(56) References Cited

U.S. PATENT DOCUMENTS

| | | | |
|---|---|---|---|
| 4,862,246 A | 8/1989 | Masuda et al. | |
| 5,623,163 A | 4/1997 | Izumi | |
| 5,753,969 A | 5/1998 | Suzuya et al. | |
| 5,898,216 A | 4/1999 | Steffen | |
| 5,973,388 A | 10/1999 | Chew et al. | |
| 6,127,206 A | 10/2000 | Nakamichi | |
| 6,166,430 A | 12/2000 | Yamaguchi | |
| 6,197,615 B1 | 3/2001 | Song et al. | |
| 6,448,633 B1 * | 9/2002 | Yee et al. | 257/666 |
| 6,483,178 B1 | 11/2002 | Chuang | |
| 6,501,161 B1 * | 12/2002 | Lee | 257/676 |
| 6,639,306 B2 | 10/2003 | Huang | |
| 6,661,083 B2 | 12/2003 | Lee et al. | |
| 6,815,833 B2 | 11/2004 | Lee et al. | |
| 7,042,071 B2 | 5/2006 | Minamio et al. | |
| 7,060,535 B2 | 6/2006 | Sirinorakul et al. | |
| 7,060,536 B2 | 6/2006 | Punzalan et al. | |
| 7,115,978 B2 | 10/2006 | Sun et al. | |

(Continued)

FOREIGN PATENT DOCUMENTS

JP    05291467 A  * 11/1993

OTHER PUBLICATIONS

Machine Translation of JP 05291467, obtained online on Nov. 13, 2010.*

(Continued)

*Primary Examiner* — Eugene Lee
*Assistant Examiner* — Peniel M Gumedzoe
(74) *Attorney, Agent, or Firm* — Mikio Ishimaru

(57) ABSTRACT

A method of manufacture of an integrated circuit package system includes forming a paddle having a paddle top surface, the paddle top surface having a depression provided therein, forming an external interconnect having a lead tip and a lead body with the lead body having a first recess segment along a length-wise dimension of the lead body, connecting a device over the paddle top surface and the external interconnect, and filling a substantially electrically nonconductive material in the depression.

20 Claims, 7 Drawing Sheets

U.S. PATENT DOCUMENTS

| | | |
|---|---|---|
| 7,221,045 B2 | 5/2007 | Park et al. |
| 7,361,531 B2 | 4/2008 | Sharma et al. |
| 2002/0079561 A1* | 6/2002 | Yasunaga et al. ............. 257/670 |
| 2004/0046240 A1* | 3/2004 | Hasebe et al. ................ 257/678 |
| 2004/0084757 A1 | 5/2004 | Seo |
| 2004/0175864 A1 | 9/2004 | Mahle |
| 2004/0227217 A1 | 11/2004 | Jang |
| 2004/0262781 A1* | 12/2004 | Germain et al. ............. 257/787 |
| 2005/0051876 A1 | 3/2005 | Manalac et al. |
| 2005/0242417 A1 | 11/2005 | Youn et al. |
| 2005/0258521 A1* | 11/2005 | Park et al. .................... 257/670 |
| 2007/0170559 A1 | 7/2007 | Camacho et al. |
| 2008/0067640 A1 | 3/2008 | Do et al. |
| 2008/0067698 A1 | 3/2008 | Do et al. |

OTHER PUBLICATIONS

K. Gilleo, Area Array Processes, McGraw Hill, 2004, p. 99.

* cited by examiner

INTEGRATED CIRCUIT PACKAGE SYSTEM WITH ENCAPSULATION LOCK AND METHOD OF MANUFACTURE THEREOF

CROSS-REFERENCE TO RELATED APPLICATION

This is a divisional of co-pending U.S. patent application Ser. No. 11/532,508 filed Sep. 15, 2006.

The present application contains subject matter related to U.S. patent application Ser. No. 11/532,510. The related application is assigned to STATS ChipPAC Ltd.

The present application also contains subject matter related to U.S. patent application Ser. No. 11/532,509. The related application is assigned to STATS ChipPAC Ltd.

TECHNICAL FIELD

The present invention relates generally to integrated circuit packages and more particularly to molded integrated circuit packages.

BACKGROUND ART

Modern electronics, such as smart phones, personal digital assistants, location based services devices, enterprise class servers, or enterprise class storage arrays, are packing more integrated circuits into an ever shrinking physical space with expectations for decreasing cost. Contemporary electronics expose integrated circuits and packages to more demanding and sometimes new environmental conditions, such as cold, heat, and humidity requiring integrated circuit packages to provide robust structures.

Numerous technologies have been developed to meet these requirements. Some of the research and development strategies focus on new technologies while others focus on improving the existing and mature technologies. Research and development in the existing technologies may take a myriad of different directions.

One proven way to reduce cost is to use mature package technologies with existing manufacturing methods and equipments. Existing packaging technologies struggle to cost effectively meet the ever demanding thermal, reliability, and structural requirements of today's integrated circuits and packages.

Most integrated circuit devices use molded plastic epoxy as an epoxy mold compound (EMC) for protecting package. But the poor heat dissipation property of EMC sometimes leads to device malfunctions. Some integrated circuit devices are large and/or very thin such that they become susceptible to warpage. Both heat and warpage may lead to delamination of the molding compound. The encapsulation delamination may also pose other problems, such as poor performance in moisture level sensitivity (MSL) tests.

A variation of existing technologies uses mature package technologies with lead fingers made from lead frames. However, lead frame packages typically use bond wires electrically connecting the lead fingers to the integrated circuit. Another variation of existing technologies uses solder bumps on the integrated circuit with a flip chip mounting. Yet another variation combines flip chip style mounting with lead frame packages.

The lead design of integrated circuit packages, such as quad flat nonleaded (QFN) packages, generally has a lug feature to provide locking between lead and mold compound. But, it adversely reduces metal-to-metal space and disturbs mold compound flow. This impact is bigger than other types of lead frame packages due to its inherently small size of the package. As a result, it causes reliability problem such as delamination between lead, tie-bar or paddle and mold compound or internal void. When it comes to the Flip Chip packages, die area covers more space above the paddle and some portion of leads as well and the problem tends to be more serious or more frequent.

Thus, a need still remains for an integrated circuit package system providing low cost manufacturing and improved reliability for the integrated circuit package. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit package system including forming a paddle having a paddle top surface, the paddle top surface having a depression provided therein, forming an external interconnect having a lead tip and a lead body with the lead body having a first recess segment along a length-wise dimension of the lead body, connecting a device over the paddle top surface and the external interconnect, and filling a substantially electrically nonconductive material in the depression.

The present invention provides an integrated circuit package system, including: a paddle having a paddle top surface, the paddle top surface having a depression provided therein, an external interconnect having a lead tip and a lead body with the lead body having a first recess segment along a length-wise dimension of the lead body, a device over the paddle top surface, an internal interconnect between the device and the external interconnect, and a substantially electrically nonconductive material in the depression.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
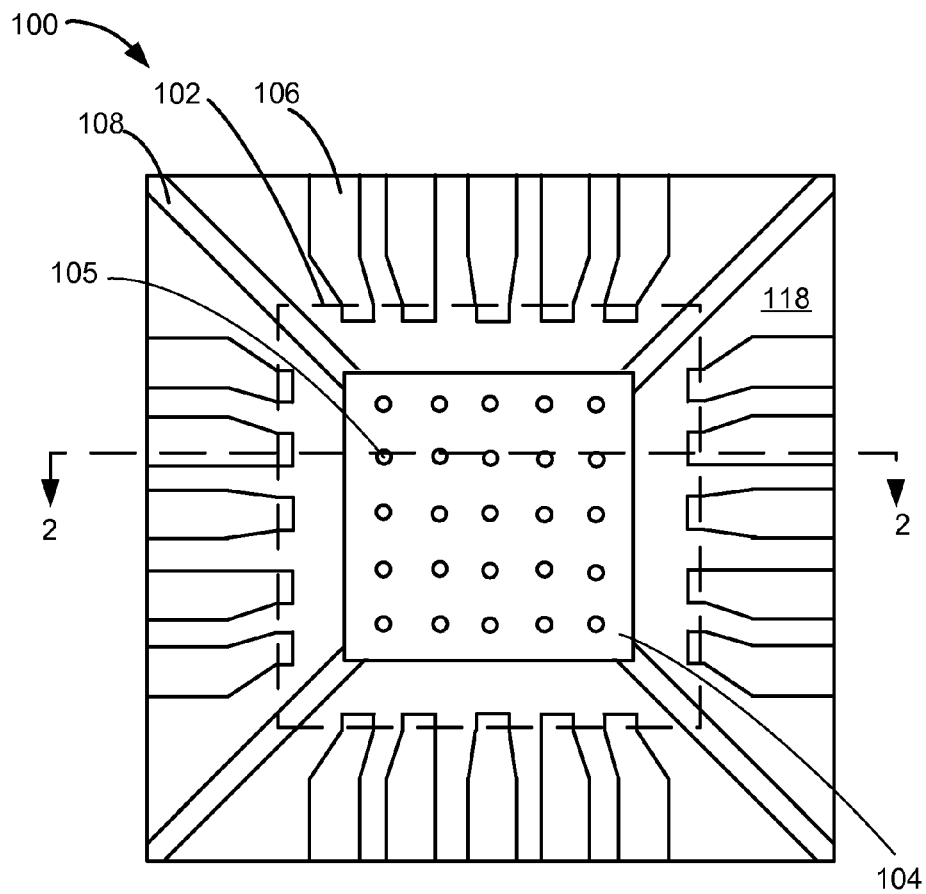
FIG. 1 is a plan view of an integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Referring now to FIG. 1, therein is shown a plan view of an integrated circuit package system 100 in an embodiment of the present invention. The integrated circuit package system 100 includes a device 102, such as an integrated circuit die, over a paddle 104, such as die-attach paddle. The paddle 104 includes a depression 105, such as an array of dimples, a moat, or a depression in a geometric shape of an x-mark. The device 102 extends over a portion of external interconnects 106, such as leads, and tie bars 108. The tie bars 108 connect to the corners of the paddle 104.

An encapsulation 118, such as an epoxy mold compound, covers the device 102, the paddle 104, the tie bars 108, and the external interconnects 106. The encapsulation 118 fills the depression 105, wherein the encapsulation 118 is a substantially electrically nonconductive material such as an epoxy mold compound (EMC).

Figure 2:
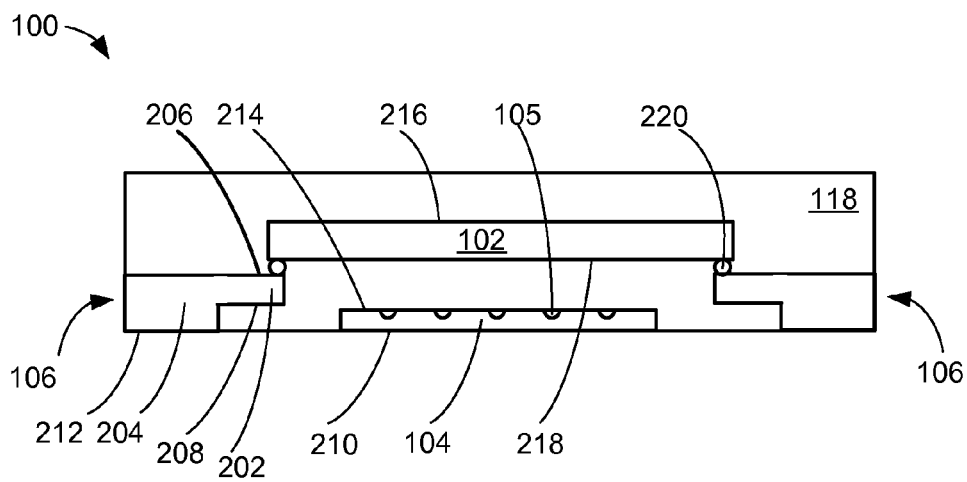
FIG. 2 is a cross-sectional view of the integrated circuit package system of FIG. 1.

Referring now to FIG. 2, therein is shown a cross-sectional view of the integrated circuit package system 100 of FIG. 1. The cross-sectional view is along segment 2-2 in FIG. 1. Each of the external interconnects 106 has a lead tip 202 and a lead body 204. The lead tip 202 may be formed by any number of processes, such as half etching the external interconnects 106. The formation for the lead tip 202 also forms the lead body 204. The lead tip 202 has a lead tip top surface 206 to a lead tip bottom surface 208.

The paddle 104 is between the external interconnects 106. A paddle bottom surface 210 of the paddle 104 is in substantially the same horizontal plane as a lead body bottom surface 212. The paddle 104 may be formed by any number of processes, such as by half etching. The depression 105 is from a paddle top surface 214 of the paddle 104. The paddle top surface 214 is below the lead tip top surface 206. The paddle 104 may serve multiple functions, such as thermal dissipation or ground connection.

The encapsulation 118 fills the depression 105 in the paddle 104 providing improved adhesion between the encapsulation 118 and the paddle 104. The improved adhesion improves performance in moisture sensitivity level (MSL) test. The depression 105 may be formed by any number of processes such as etching or half-etching the paddle 104. The device 102 does not contact the paddle 104.

For illustrative purposes, the depression 105 is shown from the paddle top surface 214 and not extending to the paddle bottom surface 210, although it is understood that the depression 105 or a portion of the depression 105 may traverse through the paddle 104. Also for illustrative purposes, the paddle top surface 214 is described as below the same horizontal plane as the lead tip top surface 206, although it is understood that the paddle top surface 214 may not be below the lead tip top surface 206. Further for illustrative purposes, the paddle bottom surface 210 is described as in substantially the same horizontal plane as the lead body bottom surface 212, although it is understood that the paddle bottom surface 210 and the lead body bottom surface 212 may not be in substantially the same horizontal plane.

The device 102 has a non-active side 216 and an active side 218. The device 102 is over the paddle 104 and connect to the lead tip 202 with an internal interconnect 220, such as a solder bump. The internal interconnect 220 is on the active side 218.

Figure 3:
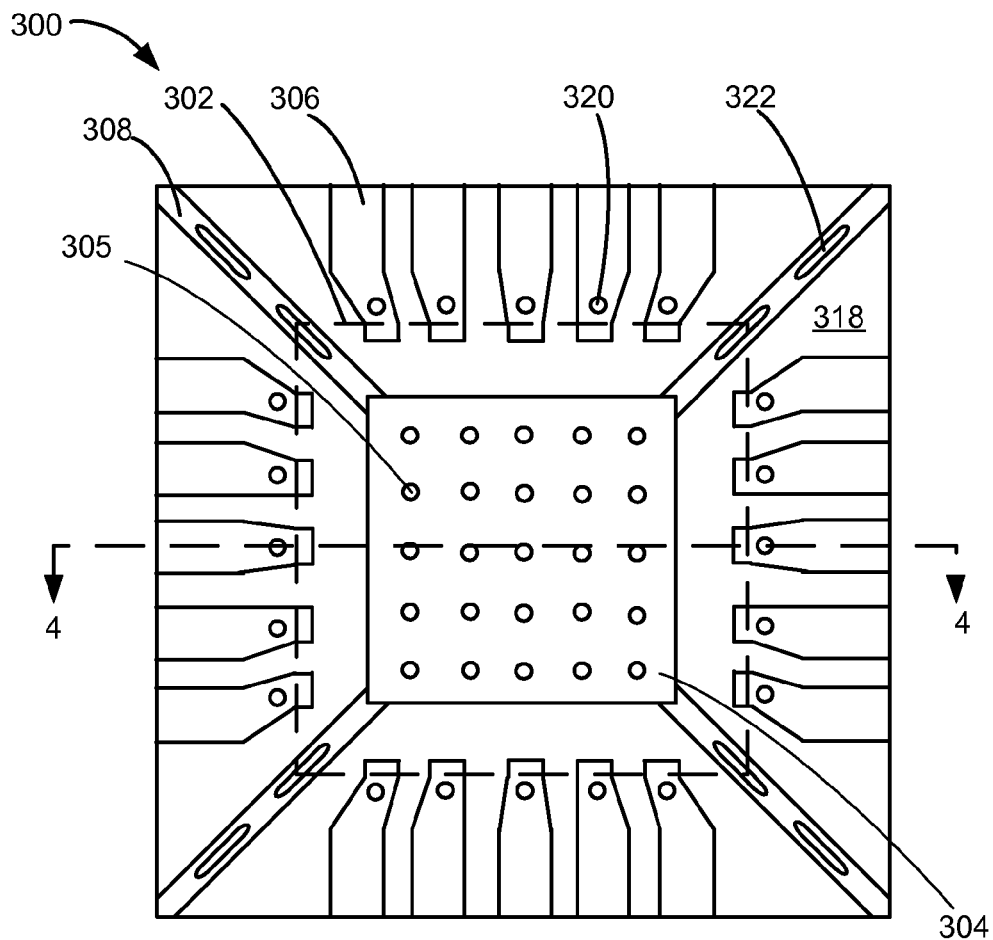
FIG. 3 is a plan view of an integrated circuit package system in an alternative embodiment of the present invention.

Referring now to FIG. 3, therein is shown a plan view of an integrated circuit package system 300 in an alternative embodiment of the present invention. The integrated circuit package system 300 includes a device 302, such as an integrated circuit die, over a paddle 304, such as die-attach paddle. The paddle 304 includes a depression 305, such as an array of dimples, a moat, or a depression in a geometric shape of an x-mark. The device 302 extends over a portion of external interconnects 306, such as leads, and tie bars 308. The tie bars 308 connect to the corners of the paddle 304.

The external interconnects 306 have holes 320, such as through holes. The holes 320 are located towards the interior portion, to the integrated circuit package system 300, of the external interconnects 306 relative. The tie bars 308 have slots 322.

An encapsulation 318, such as an epoxy mold compound, covers the device 302, the paddle 304, the tie bars 308, and the external interconnects 306. The encapsulation 318 flows through and fills the holes 320 in the external interconnects 306 as well as the slots 322 of the tie bars 308 forming mold locks. The mold locks form structural reinforcement holding the encapsulation 318 in place. The mold locks help resist delamination of the encapsulation and improves performance in moisture sensitivity level (MSL) test. The encapsulation 318 also fills the depression 305 in the paddle 304, wherein the encapsulation 318 is a substantially electrically nonconductive material such as an epoxy mold compound (EMC).

For illustrative purpose, the tie bars 308 are shown having two instances of the slots 322, although it is understood that the number of the slots 322 may differ. Also for illustrative purposes, the slots 322 are shown as a substantially the same, although it is understood that the slots 322 may differ from one another.

Figure 4:
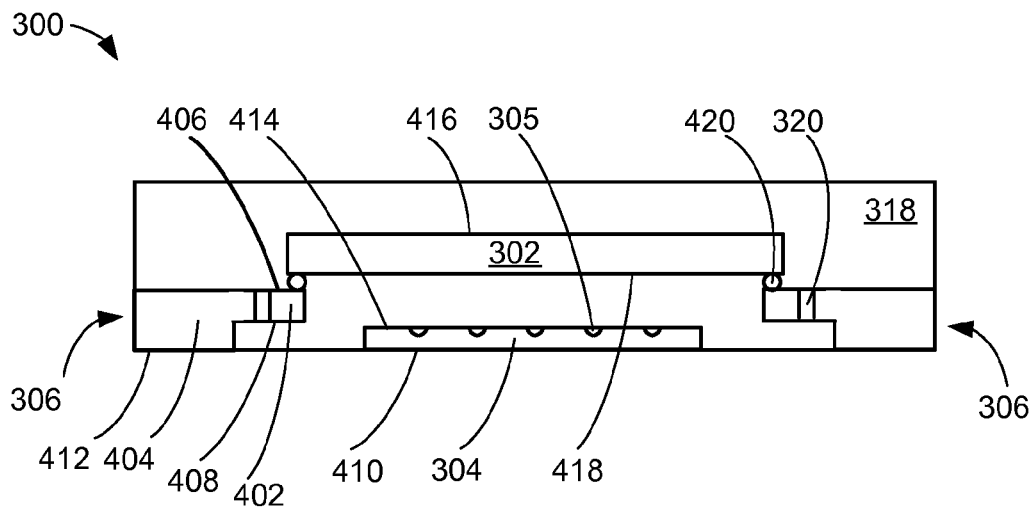
FIG. 4 is a cross-sectional view of the integrated circuit package system of FIG. 3.

Referring now to FIG. 4, therein is shown a cross-sectional view of the integrated circuit package system 300 of FIG. 3. The cross-sectional view is along segment 4-4 in FIG. 3. Each of the external interconnects 306 has a lead tip 402 and a lead body 404. The lead tip 402 may be formed by any number of processes, such as half etching the external interconnects 306. The formation for the lead tip 402 also forms the lead body 404. The lead tip 402 has the holes 320 from a lead tip top surface 406 to a lead tip bottom surface 408.

The paddle 304 is between the external interconnects 306. A paddle bottom surface 410 of the paddle 304 is in substantially the same horizontal plane as a lead body bottom surface 412. The paddle 304 may be formed by any number of processes, such as by half etching. The depression 305 is from a paddle top surface 414 of the paddle 304. The paddle top surface 414 is below the lead tip top surface 406. The paddle 304 may serve multiple functions, such as thermal dissipation or ground connection.

The encapsulation 318 fills the depression 305 in the paddle 304 providing improved adhesion between the encapsulation 318 and the paddle 304. The improved adhesion improves performance in moisture sensitivity level (MSL) test. The depression 305 may be formed by any number of processes such as etching or half-etching the paddle 304. The device 302 does not contact the paddle 304.

For illustrative purpose, the depression 305 is shown from the paddle top surface 414 and not extending to the paddle bottom surface 410, although it is understood that the depression 305 or a portion of the depression 305 may traverse through the paddle 304. Also for illustrative purpose, the paddle top surface 414 is described as below the same horizontal plane as the lead tip top surface 406, although it is understood that the paddle top surface 414 may not be below the lead tip top surface 406. Further for illustrative purposes, the paddle bottom surface 410 is described as in substantially the same horizontal plane as the lead body bottom surface 412, although it is understood that the paddle bottom surface 410 and the lead body bottom surface 412 may not be in substantially the same horizontal plane.

The device 302 has a non-active side 416 and an active side 418. The device 302 is over the paddle 304 and connect to the lead tip 402 with an internal interconnect 420, such as a solder bump. The internal interconnect 420 is on the active side 418. The connection of the internal interconnect 420 do not fill the holes 320. The encapsulation 318 fills the holes 320 to provide mold locks for the integrated circuit package system 300.

Figure 5:
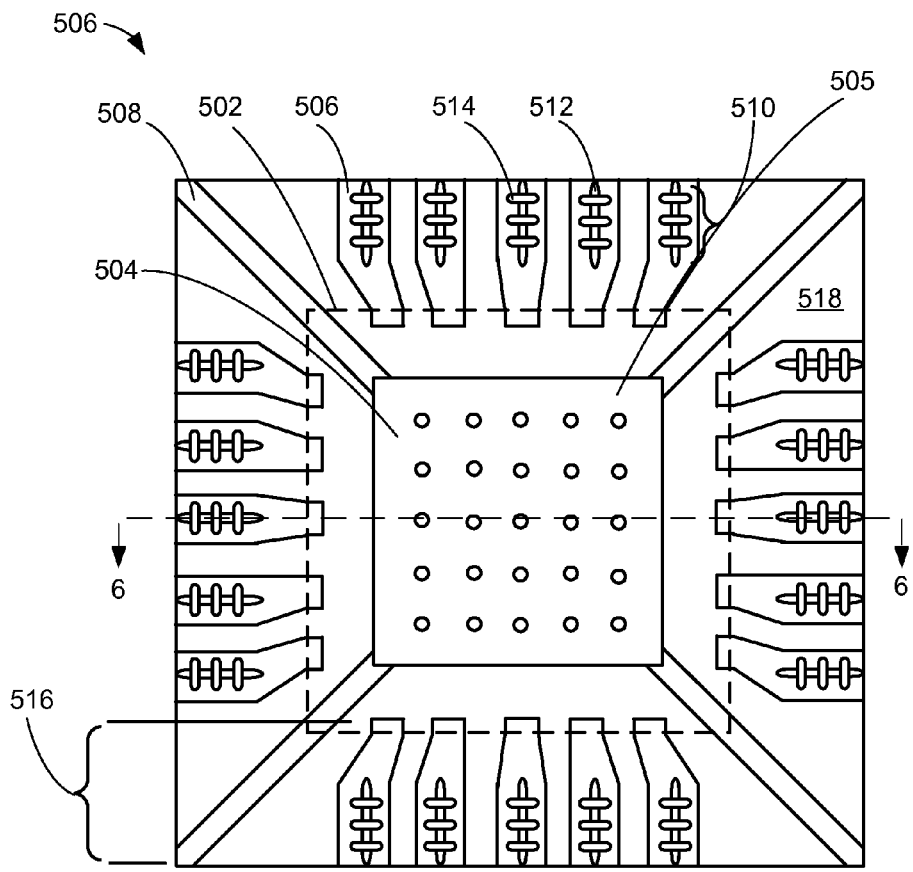
FIG. 5 is a plan view of an integrated circuit package system in another alternative embodiment of the present invention.

Referring now to FIG. 5, therein is shown a plan view of an integrated circuit package system 500 in another alternative embodiment of the present invention. The integrated circuit package system 500 includes a device 502, such as an integrated circuit die, over a paddle 504, such as die-attach paddle. The paddle 504 includes a depression 505, such as an array of dimples, a moat, or a depression in a geometric shape of an x-mark. The device 502 extends over a portion of external interconnects 506, such as leads, and tie bars 508. The tie bars 508 connect to the corners of the paddle 504.

Each of the external interconnects 506 has a recess 510, such as an intersecting recess segments. The recess 510 is located towards an edge of the integrated circuit package system 500. The recess 510 has a first recess segment 512 and a second recess segment 514. The first recess segment 512 is along a length-wise dimension 516 of the external interconnects 506. The second recess segment 514 is perpendicular to and is substantially bisected by the first recess segment 512. The recess 510 has the first recess segment 512 and three instances of the second recess segment 514.

For illustrative purposes, the recess 510 areas shown has one instance of the first recess segment 512 and three instances of the second recess segment 514, although it is understood that the number of the first recess segment 512 and the second recess segment 514 may differ. Also for illustrative purposes, the configuration of the recess 510 has the first recess segment 512 orthogonal with the second recess segment 514, although it is understood that the first recess segment 512 and the second recess segment 514 may be in a different configuration. Further, for illustrative purposes, the recess 510 is shown having both the first recess segment 512 and the second recess segment 514, although it is understood that the recess 510 may not have both the first recess segment 512 and the second recess segment 514.

An encapsulation 518, such as an epoxy mold compound, covers the device 502, the paddle 504, the tie bars 508, and the external interconnects 506. The encapsulation 518 fills the recess 510 in the external interconnects 506 forming mold locks. The tie bars 508 and the paddle 504 also provide mold locks. The mold locks form structural reinforcement holding the encapsulation 518 in place. The mold locks help resist delamination of the encapsulation and improves performance in moisture sensitivity level (MSL) test. The encapsulation 518 also fills the depression 505 in the paddle 504, wherein the encapsulation 518 is a substantially electrically nonconductive material such as an epoxy mold compound (EMC).

Figure 6:
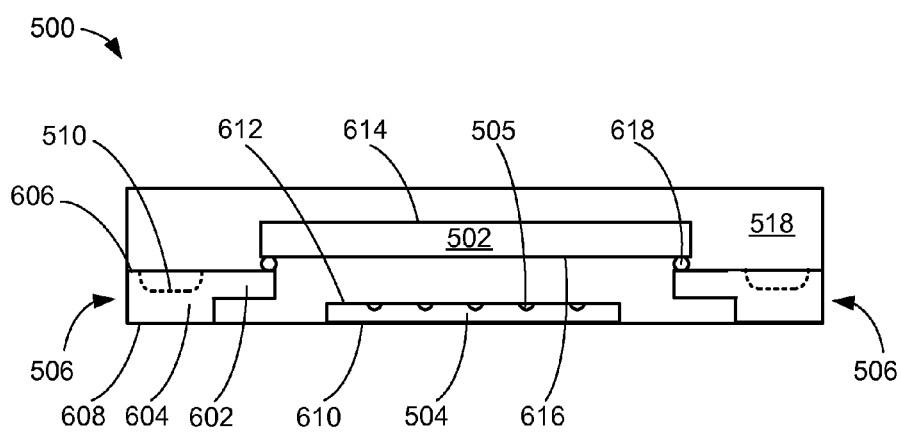
FIG. 6 is a cross-sectional view of the integrated circuit package system of FIG. 5.

Referring now to FIG. 6, therein is shown a cross-sectional view of the integrated circuit package system 500 of FIG. 5. The cross-sectional view is along segment 6-6 in FIG. 5. Each of the external interconnects 506 has a lead tip 602 and a lead body 604. The lead tip 602 may be formed by any number of processes, such as half etching the external interconnects 506.

The formation for the lead tip 602 also forms the lead body 604. The lead body 604 has the recess 510 from a lead body top surface 606 of the lead body 604. A lead body bottom surface 608 of the lead body 604 is used for connections to the next system level (not shown), such as a printed circuit board or another integrated circuit package system.

The paddle 504 is between the external interconnects 506. A paddle bottom surface 610 of the paddle 504 is in substantially the same horizontal plane as the lead body bottom surface 608. The paddle 504 may be formed by any number of processes, such as by half etching. A paddle top surface 612 of the paddle 504 is below the lead body top surface 606. The paddle 504 may serve multiple functions, such as thermal dissipation or ground connection.

The encapsulation 518 fills the depression 505 in the paddle 504 providing improved adhesion between the encapsulation 518 and the paddle 504. The improved adhesion improves performance in moisture sensitivity level (MSL) test. The depression 505 may be formed by any number of processes such as etching or half-etching the paddle 504. The device 502 does not contact the paddle 504.

For illustrative purposes, the depression 505 is shown from the paddle top surface 612 and not extending to the paddle bottom surface 610, although it is understood that the depression 505 or a portion of the depression 505 may traverse through the paddle 504. Also for illustrative purposes, the paddle top surface 612 is described as not in substantially the same horizontal plane as the lead body top surface 606, although it is understood that the paddle top surface 612 and the lead body top surface 606 may be in substantially the same horizontal plane. Further for illustrative purposes, the paddle bottom surface 610 is described as in substantially the same horizontal plane as the lead body bottom surface 608, although it is understood that the paddle bottom surface 610 and the lead body bottom surface 608 may not be in substantially the same horizontal plane.

The device 502 has a non-active side 614 and an active side 616. The device 502 is over the paddle 504 and connect to the lead tip 602 with an internal interconnect 618, such as a solder bump. The internal interconnect 618 is on the active side 616. The connection of the internal interconnect 618 do not fill the recess 510.

Figure 7:
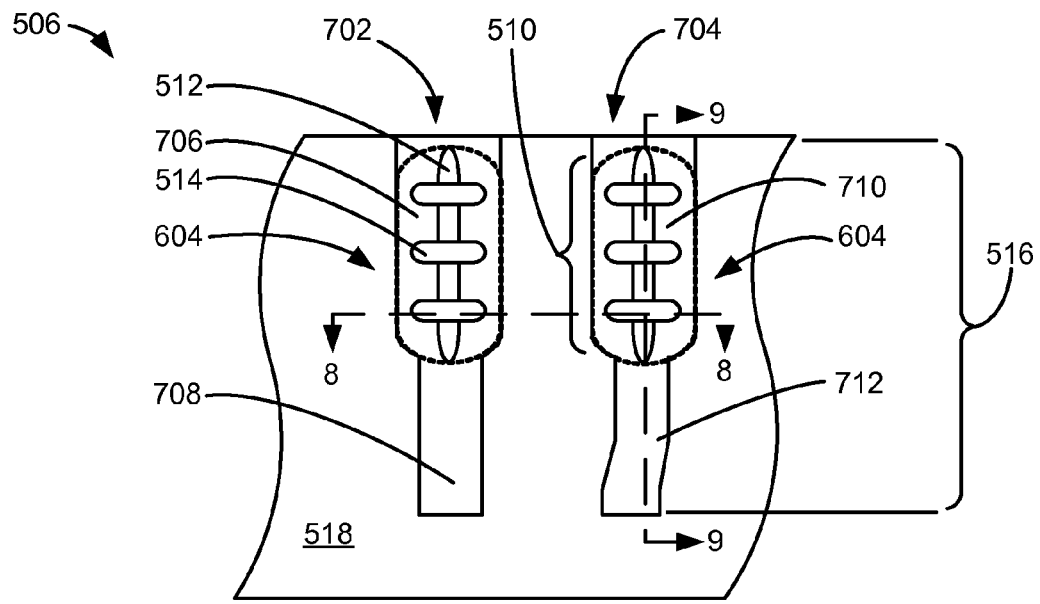
FIG. 7 is a more detailed plan view of a portion of the external interconnects of FIG. 5.

Referring now to FIG. 7, therein is shown a more detailed plan view of a portion of the external interconnects 506 of FIG. 7. This view depicts the portion of the external interconnects 506, such as a first external interconnect 702 and a second external interconnect 704.

The first external interconnect 702 has a first lead body 706 and a first lead tip 708. The first lead tip 708 is shown as a substantially straight segment extending from the first lead body 706. One instance of the recess 510 is in the first lead body 706. The second external interconnect 704 has a second lead body 710 and a second lead tip 712 The second lead tip 712 extends from the second lead body 710 with a displacement portion such that a tip end of the second lead tip 712 does not extend substantially straight from a body end of the second lead tip 712 next to the second lead body 710.

The first recess segment 512 has an orientation substantially parallel to the length-wise dimension 516 of the first lead body 706. The second recess segment 514 is perpendicular to and intersects the first recess segment 512 in the first lead body 706. Similarly, one instance of the recess 510 is also part of the second lead body 710. The first recess segment 512 and the second recess segment 514 are in a similar configuration in the second external interconnect 704 as in the first external interconnect 702.

The encapsulation 518 of FIG. 5 fills in the recess 510, such as the first recess segment 512 and the second recess segment 514, to form a mold lock from the top of the lead body 604, such as the first lead body 706 and the second lead body 710. The recess 510, with the intersecting pattern, is part of the mold lock in the horizontal dimensions of the integrated circuit package system 500 of FIG. 5.

Figure 8:
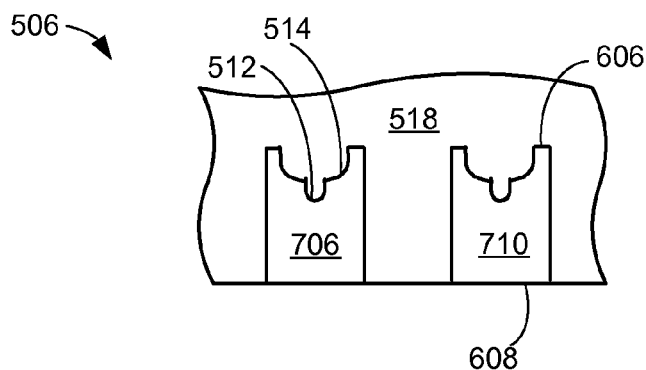
FIG. 8 is a cross-sectional view of the portion of the external interconnects of FIG. 7.

Referring now to FIG. 8, therein is shown a cross-sectional view of the portion of the external interconnects 506 of FIG. 7. The cross-sectional view is along the segment 8-8 in FIG. 7 showing the cross sections of the first lead body 706 and the second lead body 710.

The first lead body 706 has the second recess segment 514 in a curve shape from the lead body top surface 606. The first recess segment 512 is shown as another recess to the second intersecting recess segment and at a bottom portion of the second recess segment 514. The first recess segment 512 and the second recess segment 514 do not extend through the lead body bottom surface 608 of both the first lead body 706 and the second lead body 710. The encapsulation 518 fills the first recess segment 512 and the second recess segment 514.

Figure 9:
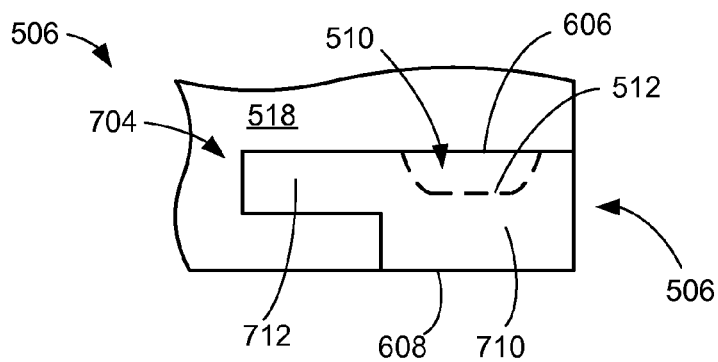
FIG. 9 is a different cross-sectional view of the portion of the external interconnects of FIG. 7.

Referring now to FIG. 9, therein is shown a different cross-sectional view of the portion of the external interconnects 506 of FIG. 7. The cross-sectional view is along the segment 9-9 in FIG. 7 showing the cross section of the second external interconnect 704 and may represent a similar cross section of any of the external interconnects 506 of FIG. 5.

This cross section shows the second lead tip 712 and the second lead body 710. An outline of the first recess segment 512 is shown as having a curve shape at the ends and flat in the middle. The first recess segment 512 is shown from the lead body top surface 606 and within the second lead body 710 while not part of the second lead tip 712. As mentioned earlier, the first recess segment 512 does not extend to the lead body bottom surface 608.

As mentioned earlier, the encapsulation 518 fills in the recess 510. The recess 510, with the paddle 504 of FIG. 5 and the lead tip 602 of FIG. 6, are also part of the mold lock in the vertical dimensions of the integrated circuit package system 300 of FIG. 5.

Figure 10:
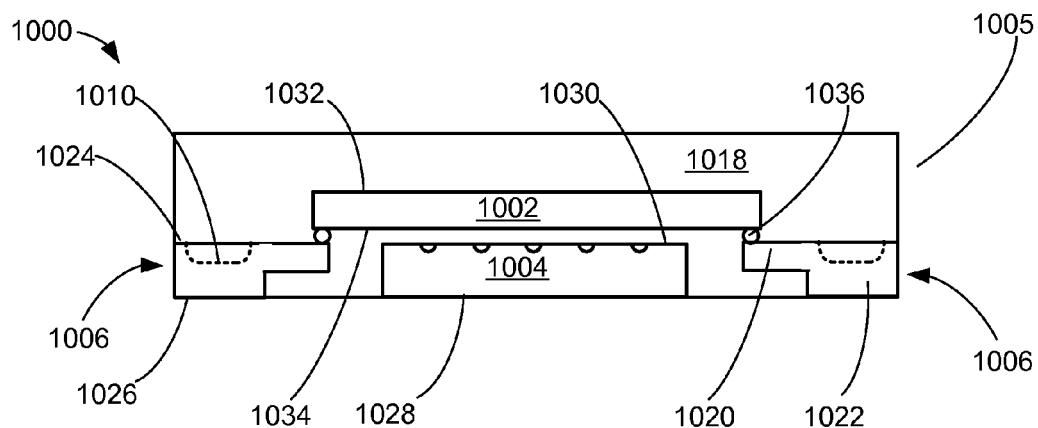
FIG. 10 is a cross-sectional view of an integrated circuit package system in yet another alternative embodiment of the present invention.

Referring now to FIG. 10, therein is shown a cross-sectional view of an integrated circuit package system 1000 in yet another alternative embodiment of the present invention. This cross-sectional view may represent the cross section of the integrated circuit package system 500 along segment 6-6 in FIG. 5. Each of external interconnects 1006 has a lead tip 1020 and a lead body 1022. The lead tip 1020 may be formed by any number of processes, such as half etching the external interconnects 1006.

The formation for the lead tip 1020 also forms the lead body 1022. The lead body 1022 has a recess 1010 from a lead body top surface 1024 of the lead body 1022. A lead body bottom surface 1026 of the lead body 1022 is used for connections to the next system level (not shown), such as a printed circuit board or another integrated circuit package system.

A paddle 1004 is between the external interconnects 1006. A paddle bottom surface 1028 of the paddle 1004 is in substantially the same horizontal plane as the lead body bottom surface 1026. The paddle 1004 may be formed by any number of processes, such as by punch or stamp of a lead frame (not shown). A paddle top surface 1030 of the paddle 1004 is in substantially the same horizontal plane as the lead body top surface 1024. The paddle 1004 from the paddle top surface 1030 has a depression 1005. A device 1002 does not contact the paddle 1004. The paddle 1004 may serve multiple functions, such as thermal dissipation or ground connection.

For illustrative purpose, the paddle top surface 1030 is described as in substantially the same horizontal plane as the lead body top surface 1024, although it is understood that the paddle top surface 1030 and the lead body top surface 1024 may not be in substantially the same horizontal plane. Also for illustrative purposes, the paddle bottom surface 1028 is described as in substantially the same horizontal plane as the lead body bottom surface 1026, although it is understood that the paddle bottom surface 1028 and the lead body bottom surface 1026 may not be in substantially the same horizontal plane.

The device 1002, such as an integrated circuit die, has a non-active side 1032 and an active side 1034. The device 1002 is over the paddle 1004 and connect to the lead tip 1020 with an internal interconnect 1036, such as a solder bump. The internal interconnect 1036 is on the active side 1034. The connection of the internal interconnect 1036 do not fill the recess 1010.

An encapsulation 1018, such as a substantially electrically nonconductive material or an epoxy mold compound (EMC), fills the recess 1010 to provide mold locks for the integrated circuit package system 1000. The encapsulation 1018 also fills the depression 1005 in the paddle 1004 providing improved adhesion between the encapsulation 1018 and the paddle 1004.

Figure 11:
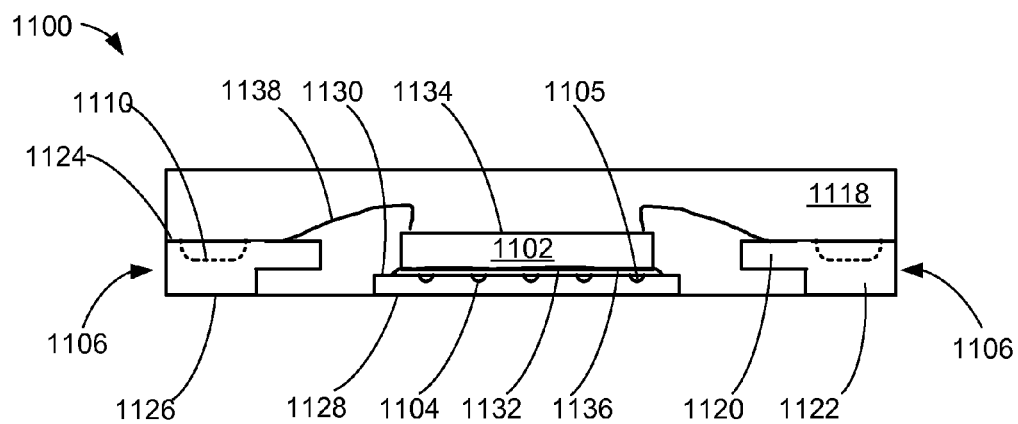
FIG. 11 is a cross-sectional view of an integrated circuit package system in yet another alternative embodiment of the present invention.

Referring now to FIG. 11, therein is shown a cross-sectional view of an integrated circuit package system 1100 in yet another alternative embodiment of the present invention. Each of external interconnects 1106 has a lead tip 1120 and a lead body 1122. The lead tip 1120 may be formed by any number of processes, such as half etching the external interconnects 1106.

The formation for the lead tip 1120 also forms the lead body 1122. The lead body 1122 has a recess 1110 from a lead body top surface 1124 of the lead body 1122. A lead body bottom surface 1126 of the lead body 1122 is used for connections to the next system level (not shown), such as a printed circuit board or another integrated circuit package system.

A paddle 1104 is between the external interconnects 1106. A paddle bottom surface 1128 of the paddle 1104 is in substantially the same horizontal plane as the lead body bottom surface 1126. The paddle 1104 may be formed by any number of processes, such as by half etching. A paddle top surface 1130 of the paddle 1104 is below the lead body top surface 1124. The paddle 1104 from the paddle top surface 1130 has a depression 1105. The paddle 1104 may serve multiple functions, such as thermal dissipation or ground connection.

For illustrative purpose, the paddle top surface 1130 is described as not in substantially the same horizontal plane as the lead body top surface 1124, although it is understood that the paddle top surface 1130 and the lead body top surface 1124 may be in substantially the same horizontal plane. Also for illustrative purposes, the paddle bottom surface 1128 is described as in substantially the same horizontal plane as the lead body bottom surface 1126, although it is understood that the paddle bottom surface 1128 and the lead body bottom surface 1126 may not be in substantially the same horizontal plane.

A device 1102, such as an integrated circuit die, has a non-active side 1132 and an active side 1134. The device 1102 is attached on the paddle 1104 with an adhesive 1136, such as a substantially electrically nonconductive material or a die attach adhesive. The active side 1134 connect to the lead tip 1120 with an internal interconnect 1138, such as bond wires.

An encapsulation 1118 fills the recess 1110 to provide mold locks for the integrated circuit package system 1100. The encapsulation 1118 also fills the depression 1105 not covered by the device 1102 or the adhesive 1136 providing improved adhesion between the encapsulation 1118 and the paddle 1104. The adhesive 1136, such as a substantially electrically nonconductive material or an epoxy mold compound (EMC), may also fill the depression 1105 reducing the delamination of the device 1102 with the paddle 1104.

Figure 12:
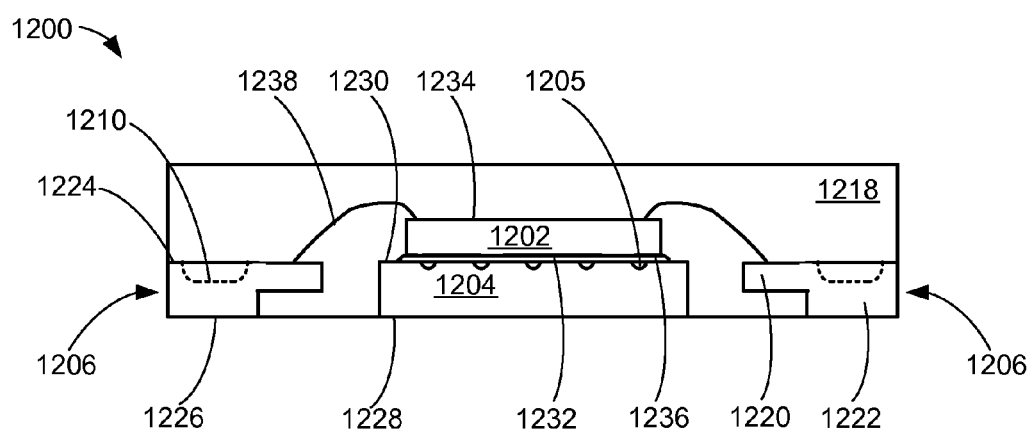
FIG. 12 is a cross-sectional view of an integrated circuit package system in yet another alternative embodiment of the present invention.

Referring now to FIG. 12, therein is shown a cross-sectional view of an integrated circuit package system 1200 in yet another alternative embodiment of the present invention. Each of external interconnects 1206 has a lead tip 1220 and a lead body 1222. The lead tip 1220 may be formed by any number of processes, such as half etching the external interconnects 1206.

The formation for the lead tip 1220 also forms the lead body 1222. The lead body 1222 has a recess 1210 from a lead body top surface 1224 of the lead body 1222. A lead body bottom surface 1226 of the lead body 1222 is used for connections to the next system level (not shown), such as a printed circuit board or another integrated circuit package system.

A paddle 1204 is between the external interconnects 1206. A paddle bottom surface 1228 of the paddle 1204 is in substantially the same horizontal plane as the lead body bottom surface 1226. The paddle 1204 may be formed by any number of processes, such as by punch or stamp of a lead frame (not shown). A paddle top surface 1230 of the paddle 1204 is in substantially the same horizontal plane as the lead body top surface 1224. The paddle 1204 from the paddle top surface 1230 has a depression 1205. The paddle 1204 may serve multiple functions, such as thermal dissipation or ground connection.

For illustrative purpose, the paddle top surface 1230 is described as in substantially the same horizontal plane as the lead body top surface 1224, although it is understood that the paddle top surface 1230 and the lead body top surface 1224 may not be in substantially the same horizontal plane. Also for illustrative purposes, the paddle bottom surface 1228 is described as in substantially the same horizontal plane as the lead body bottom surface 1226, although it is understood that the paddle bottom surface 1228 and the lead body bottom surface 1226 may not be in substantially the same horizontal plane.

A device 1202, such as an integrated circuit die, has a non-active side 1232 and an active side 1234. The device 1202 is attached on the paddle 1204 with an adhesive 1236, such as a substantially electrically nonconductive material or a die attach adhesive. The active side 1234 connect to the lead tip 1220 with an internal interconnect 1238, such as bond wires.

An encapsulation 1218 fills the recess 1210 to provide mold locks for the integrated circuit package system 1200. The encapsulation 1218 also fills the depression 1205 not covered by the device 1202 or the adhesive 1236 providing improved adhesion between the encapsulation 1218 and the paddle 1204. The adhesive 1236 may also fill the depression 1205 reducing the delamination of the device 1202 with the paddle 1204.

Figure 13:
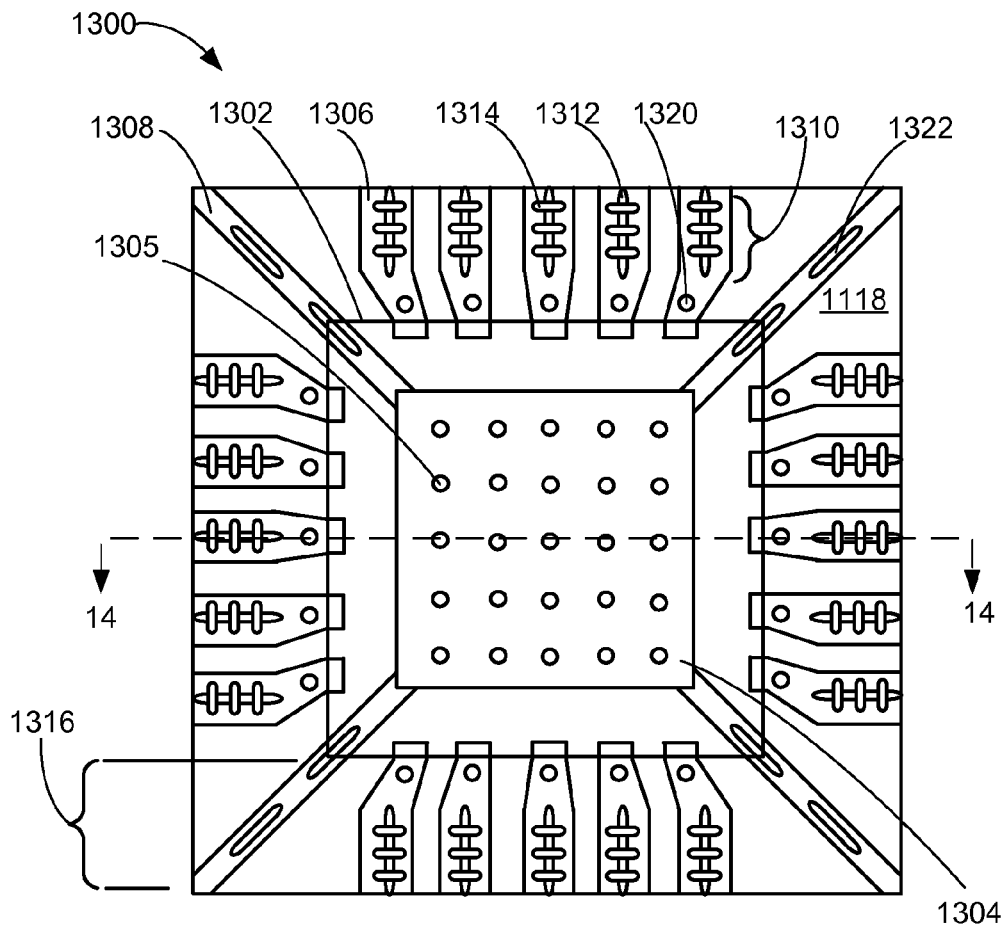
FIG. 13 is a plan view of an integrated circuit package system in yet another embodiment of the present invention.

Referring now to FIG. 13, therein is shown a plan view of an integrated circuit package system 1300 in yet another embodiment of the present invention. The integrated circuit package system 1300 includes a device 1302, such as an integrated circuit die, over a paddle 1304, such as die-attach paddle. The paddle 1304 includes a depression 1305, such as an array of dimples, a moat, or a depression in a geometric shape of an x-mark. The device 1302 extends over a portion of external interconnects 1306, such as leads, and tie bars 1308. The tie bars 1308 connect to the corners of the paddle 1304.

Each of the external interconnects 1306 has a recess 1310, such as an intersecting recess segments. The recess 1310 is located towards an edge of the integrated circuit package system 1300. The recess 1310 has a first recess segment 1312 and a second recess segment 1314. The first recess segment 1312 is along a length-wise dimension 1316 of the external interconnects 1306. The second recess segment 1314 is perpendicular to the first recess segment 1312. The recess 1310 has the first recess segment 1312 and three instances of the second recess segment 1314.

For illustrative purposes, the recess 1310 areas shown has one instance of the first recess segment 1312 and three instances of the second recess segment 1314, although it is understood that the number of the first recess segment 1312 and the second recess segment 1314 may differ. Also for illustrative purposes, the configuration of the recess 1310 has the first recess segment 1312 orthogonal with the second recess segment 1314, although it is understood that the first recess segment 1312 and the second recess segment 1314 may be in a different configuration.

The external interconnects 1306 also have holes 1320, such as through holes. The holes 1320 are located towards the interior portion, to the integrated circuit package system 1300, of the external interconnects 1306 relative. The tie bars 1308 have slots 1322.

An encapsulation 1318, such as an epoxy mold compound, covers the device 1302, the paddle 1304, the tie bars 1308, and the external interconnects 1306. The encapsulation 1318 fills the recess 1310 in the external interconnects 1306 forming mold locks. The encapsulation 1318 also flows through and fills the holes 1320 in the external interconnects 1306 as well as the slots 1322 of the tie bars 1308 forming additional mold locks. The mold locks form structural reinforcement holding the encapsulation 1318 in place. The mold locks help resist delamination of the encapsulation and improves performance in moisture sensitivity level (MSL) test.

The encapsulation 1318, such as substantially electrically nonconductive material or an epoxy mold compound (EMC), fills the depression 1305 in the paddle 1304 providing improved adhesion between the encapsulation 1318 and the paddle 1304. The improved adhesion improves performance in moisture sensitivity level (MSL) test. The depression 1305 may be formed by any number of processes such as etching or half-etching the paddle 1304. The device 1302 does not contact the paddle 1304.

Figure 14:
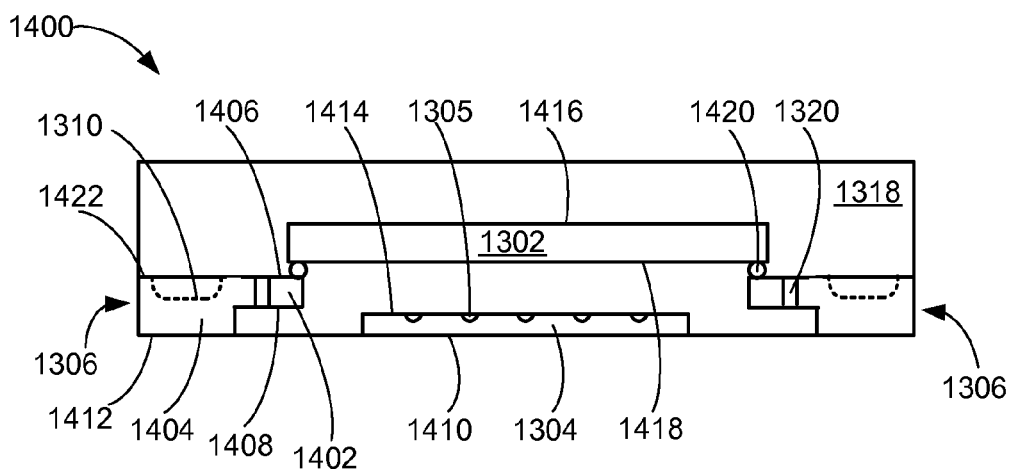
FIG. 14 is a cross-sectional view of the integrated circuit package system of FIG. 13.

Referring now to FIG. 14, therein is shown a cross-sectional view of the integrated circuit package system 1300 of FIG. 13. The cross-sectional view is along segment 14-14 in FIG. 13. Each of the external interconnects 1306 has a lead tip 1402 and a lead body 1404. The lead tip 1402 may be formed by any number of processes, such as half etching the external interconnects 1306. The lead tip 1402 has the holes 1320 from a lead tip top surface 1406 to a lead tip bottom surface 1408. The encapsulation 1318 fills the holes 1320 as well as the slots 1322 of FIG. 13 forming mold locks for the integrated circuit package system 1300.

The formation for the lead tip 1402 also forms the lead body 1404. The lead body 1404 has the recess 1310 from a lead body top surface 1422 of the lead body 1404. A lead body bottom surface 1412 of the lead body 1404 is used for connections to the next system level (not shown), such as a printed circuit board or another integrated circuit package system. The encapsulation 1318 also fills the recess 1310 to provide additional mold locks for the integrated circuit package system 1300. The encapsulation 1318 further fills the depression 1305 in the paddle 1304 providing improved adhesion between the encapsulation 1318 and the paddle 1304.

The paddle 1304 is between the external interconnects 1306. A paddle bottom surface 1410 of the paddle 1304 is in substantially the same horizontal plane as the lead body bottom surface 1412. The paddle 1304 may be formed by any number of processes, such as by half etching. A paddle top surface 1414 of the paddle 1304 is below the lead body top surface 1422. The paddle 1304 from the paddle top surface 1414 has the depression 1305. The device 1302 does not contact the paddle 1304. The paddle 1304 may serve multiple functions, such as thermal dissipation or ground connection.

For illustrative purpose, the paddle top surface 1414 is described as not in substantially the same horizontal plane as the lead body top surface 1422, although it is understood that the paddle top surface 1414 and the lead body top surface 1422 may be in substantially the same horizontal plane. Also for illustrative purposes, the paddle bottom surface 1410 is described as in substantially the same horizontal plane as the lead body bottom surface 1412, although it is understood that the paddle bottom surface 1410 and the lead body bottom surface 1412 may not be in substantially the same horizontal plane.

The device 1302 has a non-active side 1416 and an active side 1418. The device 1302 is over the paddle 1304 and connect to the lead tip 1402 with an internal interconnect 1420, such as a solder bump. The internal interconnect 1420 is on the active side 1418. The connection of the internal interconnect 1420 do not fill the recess 1310.

Figure 15:
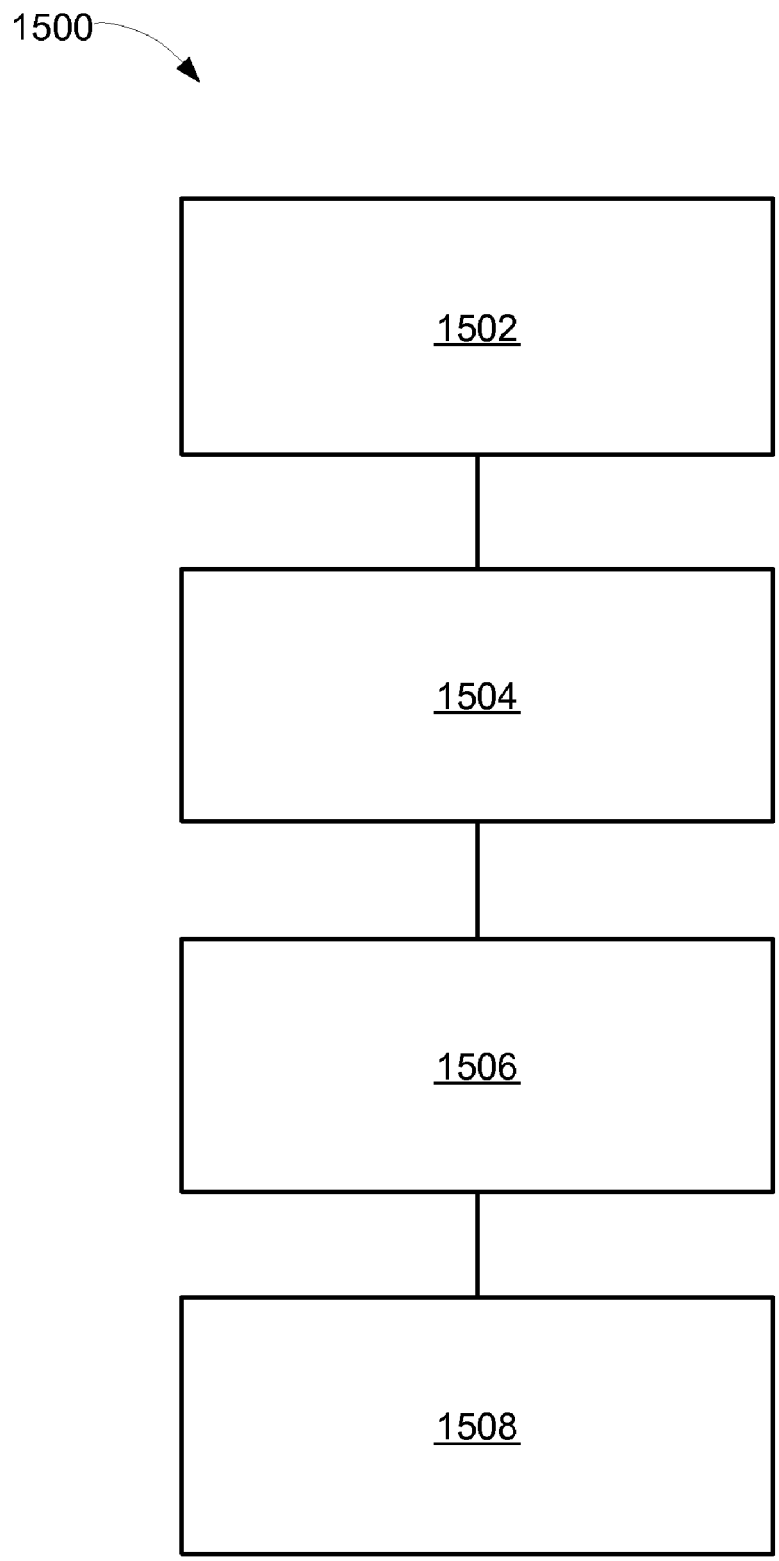
FIG. 15 is a flow chart of an integrated circuit package system for manufacture of the integrated circuit package system in an embodiment of the present invention.

Referring now to FIG. 15, therein is shown a flow chart of an integrated circuit package system 1500 for manufacture of the integrated circuit package system 100 in an embodiment of the present invention. The system 1500 includes forming a paddle having a paddle top surface, the paddle top surface having a depression provided therein in a block 1502; forming an external interconnect having a lead tip and a lead body with the lead body having a first recess segment along a length-wise dimension of the lead body in a block 1504; connecting a device over the paddle top surface and the external interconnect in a block 1506; and filling a substantially electrically nonconductive material in the depression in a block 1508.

It has been discovered that the present invention thus has numerous aspects.

It has been discovered that the present invention provides an integrated circuit package system with improved yield and reliability. The various mold lock features require less space, improves moldability, reduces delamination, and improves performance on reliability tests, such as moisture level sensitivity (MSL) test.

An aspect is that the present invention provides increased metal to metal spacing for improved molding compound flow to form the encapsulation. The depression in the paddle, intersecting recess segments, the holes in the lead tips, or the slots in the tie bars do not require additional structure, such as a lug between the external leads, to form mold locks.

Another aspect of the present invention provides depressions of various patterns in the paddle. The encapsulation fills the depression providing improved adhesion between the encapsulation and the paddle. This improved adhesion improves performance in moisture sensitivity level (MSL) test.

Yet another aspect of the present invention provides depressions of various structures such that some depressions may be through the paddle while others may not. The die-attach adhesive may also fill the depressions or a portion of the depressions reducing the delamination of the device and the paddle.

Yet another aspect of the present invention provides multiple mold lock features for a distributed and multi-dimensional locking structure support. The intersecting recess segments, the holes in the lead tips, and the slots in the tie bars as well as the paddle forms mold locks distributed throughout the integrated circuit package system. The distribution of mold locks provides support in all three dimensions of the integrated circuit package system package.

Yet another aspect of the present invention provides structures for the mold lock features with improved adhesion between the leads as well as the tie bars and the encapsulation.

Yet another aspect of the present invention provides mold lock features improves reliability performance. The distributed, multi-dimensional mold locks reduces delamination of the encapsulation and improves performance in moisture sensitivity level (MSL) tests.

Yet another aspect of the present invention provides flexibility to select various mold locks locations in the possible locations provided by the distributed, multi-dimensional mold locks. The intersecting recess segments in the external interconnects, the slots in the tie bars, the holes in the external interconnects may be used individually or any combination thereof.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system method of the present invention furnishes important and heretofore unknown and unavailable solutions, capabilities, and functional aspects for improving reliability in systems. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
   forming a paddle having a paddle top surface, the paddle top surface having a depression provided therein;
   forming an external interconnect having a lead tip and a lead body with the lead body having a first recess segment along a length-wise dimension of the lead body and the first recess segment substantially bisects a second recess segment;
   connecting a device over the paddle top surface and the external interconnect; and
   filling a substantially electrically nonconductive material in the depression, the first recess segment and the second recess segment.

2. The method as claimed in claim 1 wherein:
   forming the external interconnect includes forming the lead body having the second recess segment in a lead body top surface with the second recess segment perpendicular to the first recess segment; and
   filling the substantially electrically nonconductive material in the depression includes molding an encapsulation in the first recess segment and in the second recess segment.

3. The method as claimed in claim 1 wherein filling the substantially electrically nonconductive material in the depression includes molding an encapsulation in the first recess segment and in the depression.

4. The method as claimed in claim 1 further comprising:
   forming a tie bar having a slot with the tie bar connected to the paddle; and
   wherein filling the substantially electrically nonconductive material in the depression includes molding an encapsulation through the slot and in the first recess segment.

5. The method as claimed in claim 1 wherein filling the substantially electrically nonconductive material in the depression includes filling an adhesive in the depression.

6. A method of manufacture of an integrated circuit package system comprising:
   forming a paddle, having a depression in a paddle top surface, with a tie bar;
   forming an external interconnect having a lead tip and a lead body with a lead tip bottom surface above a lead body bottom surface and with the lead body having a first recess segment, in a lead body top surface, along a length-wise dimension of the lead body and the first recess segment substantially bisects a second recess segment;
   connecting an integrated circuit die over the paddle top surface and the external interconnect; and
   filling a substantially electrically nonconductive material in the depression, the first recess segment and the second recess segment.

7. The method as claimed in claim 6 wherein connecting the integrated circuit die and the external interconnect includes attaching a solder bump between the integrated circuit die and the lead tip.

8. The method as claimed in claim 6 wherein connecting the integrated circuit die and the external interconnect includes attaching a bond wire between the integrated circuit die and the lead tip.

9. The method as claimed in claim 6 wherein:
   forming the paddle with the tie bar includes forming the tie bar having a slot;
   forming the external interconnect includes forming the lead tip having a hole; and
   filling the substantially electrically nonconductive material in the depression includes molding an encapsulation through the slot and the hole.

10. The method as claimed in claim 6 wherein:
    forming the external interconnect includes:
       forming the lead body having the second recess segment in the lead body top surface with the second recess segment perpendicular to the first recess segment, and
       forming the lead tip having a hole;
    forming the paddle with the tie bar includes forming the tie bar having a slot; and
    filling the substantially electrically nonconductive material in the depression includes molding an encapsulation through the slot, through the hole, and in the first recess segment.

11. An integrated circuit package system comprising:
    a paddle having a paddle top surface, the paddle top surface having a depression provided therein;
    an external interconnect having a lead tip and a lead body with the lead body having a first recess segment along a length-wise dimension of the lead body and the first recess segment substantially bisects a second recess segment;
    a device over the paddle top surface;
    an internal interconnect between the device and the external interconnect; and
    a substantially electrically nonconductive material in the depression, the first recess segment and the second recess segment.

12. The system as claimed in claim 11 wherein:
    the external interconnect includes the lead body having the second recess segment in the lead body top surface with the second recess segment perpendicular to the first recess segment; and
    the substantially electrically nonconductive material includes an encapsulation in the first recess segment and in the second recess segment.

13. The system as claimed in claim 11 wherein the substantially electrically nonconductive material includes an encapsulation in the first recess segment and in the depression.

14. The system as claimed in claim 11 further comprising:
    a tie bar having a slot with the tie bar connected to the paddle; and wherein the substantially electrically nonconductive material includes an encapsulation through the slot and in the first recess segment.

15. The system as claimed in claim 11 wherein the substantially electrically nonconductive material includes an adhesive.

16. The system as claimed in claim 11 further comprising:
a tie bar connected to the paddle;
wherein:
 the external interconnect having the lead tip and the lead body includes a lead tip bottom surface above a lead body bottom surface;
 the device over the paddle top surface includes an integrated circuit die; and
 the internal interconnect between the device and the external interconnect is connected to the lead tip.

17. The system as claimed in claim 16 wherein the internal interconnect is a solder bump.

18. The system as claimed in claim 16 wherein the internal interconnect is a bond wire.

19. The system as claimed in claim 16 wherein:
the tie bar has a slot;
the lead tip has a hole; and
the substantially electrically nonconductive material includes an encapsulation through the slot and the hole.

20. The system as claimed in claim 16 wherein:
the external interconnect includes:
 the lead body having the second recess segment from the lead body top surface with the second recess segment perpendicular to the first recess segment, and
 the lead tip having a hole;
the tie bar includes the tie bar having a slot; and
the substantially electrically nonconductive material includes an encapsulation through the slot, through the hole, and in the first recess segment.

* * * * *